United States Patent [19]
Leeb

[11] Patent Number: 5,319,330
[45] Date of Patent: Jun. 7, 1994

[54] DEVICE COMPRISING LAMINATED CONDUCTIVE PATTERNS AND EASILY SELECTABLE DIELECTRICS

[75] Inventor: Karl-Erik Leeb, Djurhamn, Sweden

[73] Assignee: Telefonaktiebolaget L M Ericsson, Stockholm, Sweden

[21] Appl. No.: 897,821

[22] Filed: Jun. 12, 1992

[30] Foreign Application Priority Data

Jun. 14, 1991 [SE] Sweden .............. 9101835-8

[51] Int. Cl.⁵ .............................. H01P 3/08
[52] U.S. Cl. ............................ 333/238; 333/246; 174/117 FF; 29/830
[58] Field of Search ............ 333/238, 246, 236, 245, 333/247; 174/117 F, 117 FF, 117 AS, 117 A, 113 AS, 120 R, 120 SC; 156/644, 652, 656; 29/285, 286, 830

[56] References Cited

U.S. PATENT DOCUMENTS

| | | | |
|---|---|---|---|
| 4,561,173 | 12/1985 | Te Velde | 29/577 C |
| 4,772,864 | 9/1988 | Otto et al. | 333/238 |
| 4,870,377 | 9/1989 | Brown et al. | 333/238 |
| 4,930,215 | 6/1990 | Roche et al. | 333/238 |
| 5,158,820 | 10/1992 | Scammell | 333/238 |
| 5,164,692 | 11/1992 | Gartel et al. | 333/246 |
| 5,184,095 | 2/1993 | Hanz et al. | 333/238 |
| 5,184,210 | 2/1993 | Westbrook | 333/238 |
| 5,194,833 | 3/1993 | Dougherty et al. | 333/33 |

FOREIGN PATENT DOCUMENTS

| | | |
|---|---|---|
| 0045877 | 2/1982 | European Pat. Off. . |
| 0158876 | 10/1985 | European Pat. Off. . |
| 2945533 | 11/1983 | Fed. Rep. of Germany . |
| 161770 | 6/1989 | Norway . |

OTHER PUBLICATIONS

International-Type Search Report dated Dec. 4, 1991.
Derwent's Abstracts, nr. 247 80 K/10, SU 926 085.

*Primary Examiner*—Raymond A. Nelli
*Attorney, Agent, or Firm*—Burns, Doane, Swecker & Mathis

[57] ABSTRACT

A device with laminated conductive patterns and dielectrics which can be selected without consideration of its bonding characteristics in regard of copper metal comprises a conductor means comprising a support frame with a window in which one or more etched conductors are arranged. The conductor means is located on one surface of a dielectric sheet or between two such sheets.

18 Claims, 1 Drawing Sheet

DEVICE COMPRISING LAMINATED CONDUCTIVE PATTERNS AND EASILY SELECTABLE DIELECTRICS

FIELD OF THE INVENTION

The present invention is related to a device comprising laminated conductive patterns and dielectrics which can be selected more freely than what is now possible.

BACKGROUND OF THE INVENTION

In the manufacture of electrical circuit boards one usually starts from a laminate of copper foil and plastics. The surfaces of the copper foils are coated with a resist in a certain pattern, which resist may be photosensitive, i.e. a photoresist, or by means of silkscreen printing. Subsequently, the exposed copper surfaces are etched in order to leave a conductive pattern on the surface of the plastics board. In circuits which are to be used at high frequencies, for instance for radio frequencies, often the conductors are arranged on one side of the plastics sheet and a ground plane is located on the other side. The ground plane usually is a metal foil without any patterning and covering the entire side on the plastics sheet, where it is located and it will in use be coupled to ground voltage or some reference voltage. In this way an electric signal in the conductor is inductively coupled to the ground plane and this is called microstrip technique. In the similar way the conductor may be enclosed by plastics and ground planes on both the top side and the bottom side and this is stripline technique. In this way circuit functions, including inductances and capacitances, may be accomplished which can be used for instance in frequency filter structures. The characteristics of these circuits are dependent on the plastics material on which the circuit pattern is arranged. Thus the electromagnetic losses, the dimensional tolerances and the dielectric constant of plastic material are determinative of the characteristics of said circuits and the variations of said characteristics.

In conventional circuit board technique often the characteristics of the dielectric must be adjusted in such a way, that the lamination, often with a high pressure, to a copper foil will be possible. Further, the characteristics of the dielectrics must be such, that the dielectric will be relatively easily manipulated in the process for patterning the copper coating.

A large problem is that these requirements highly restrict the choice of possible dielectrics, this implying that material having the best possible electrical characteristics often cannot be selected. Another restricting factor in this context is the requirement that the mechanical dimensions of the conductive pattern should not be influenced too much by temperature changes, since this may cause detrimental stresses on the mounting of components and wire elongation effects in the conductors. Finally, the ambition practically always is that the manufacturing costs should be low and thus, the possibility of achieving low manufacturing costs will generally be restricted due to the restricted possibilities of material selection.

SUMMARY OF THE INVENTION

The purpose of the present invention is to eliminate the drawbacks discussed above of the prior art and to provide a device having laminar conductive patterns and dielectric materials which can be selected more freely than before in regard of its binding ability to copper metal.

This purpose is achieved by a device according to claim 1.

Thus in the device comprising laminar conductive patterns and a dielectric which can be selected there is a conductive means comprising a support frame of an isolating material and having a window, in or on top of which one or more etched conductors are arranged, said conductive means being arranged at one surface of a sheet of dielectric material or between two such sheets.

The device according to the invention is applicable for both microstrip and stripline circuits.

According to an advantageous further development of the device of the invention the support frame suitably is a thin frame of plastics and the windows in the support frame is suitably cut by means of a laser beam or a water jet.

According to another advantageous embodiment of the device of the invention stabilizing fingers are provided, which project from the support frame into the window and are located at suitable intervals in order to support or fix a conductor or the conductors if they are so long that they are no longer completely stable in shape.

SHORT DESCRIPTION OF THE FIGURES

An embodiment chosen as an example of a device according to the invention will now be described in more detail with reference to the accompanying drawing in which FIG. 1 shows a plan view of a conductive means in the device according to the invention, FIG. 2 shows a cross sectional view of a stripline circuit in the device according to the invention and FIG. 3 shows a cross sectional view of a microstrip circuit in the device according to the invention, FIG. 4 shows a cross sectional view of a device having air as a dielectric.

DESCRIPTION OF THE PREFERRED EMBODIMENT

In the figures the thicknesses illustrated of the substrates and the foils are highly exaggerated in order to clarify the invention.

Figure 1:
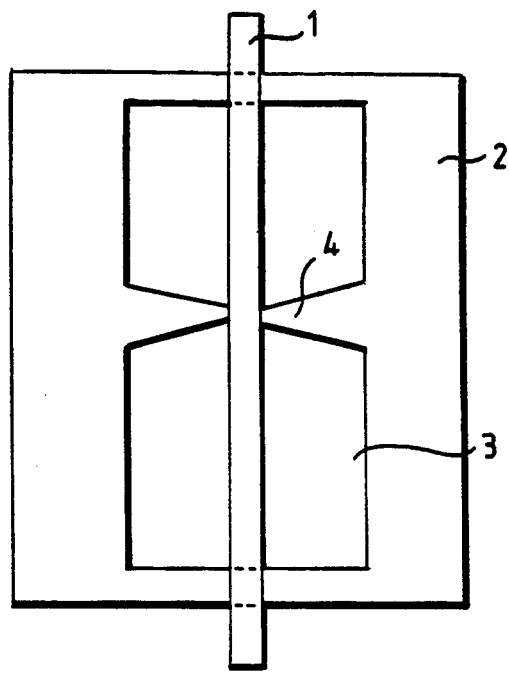

In FIG. 1 an etched conductor 1 is shown, which is laminated to a support frame 2 of thin plastics. In the support frame 2 a window 3 is cut, for instance by means of a laser beam, and the etched conductor 1 extends over or in the window 3. The material of the support frame 2 then will have to exhibit good characteristics in regard of its laminating ability to copper foil or being able to be easily coated with a copper or other conductive metal layer, such as by some deposition method.

If the conductor 1 is so long, that it is not any longer stable in shape, stabilizing fingers 4, which project from the support frame 2 into the window 3, can be arranged at suitable distances in order to support or fix the conductor 1. As is illustrated in the Figure, the window 3 may have an essentially rectangular shape and the strip or band shaped elongated conductor 3 extends centrally over the window 3 from one side of the rectangle to its opposite side, thus the conductor being located in parallel with the other sides of the rectangle constituting the window 3. The stabilizing or support fingers 4 thus project from these other sides of said rectangle, in the case illustrated from the centre of these sides, in a direction essentially perpendicular to said sides. The support fingers 4 may have a uniform width or they may be tapering, as shown, with the narrow end supporting the conductor 1.

Figure 2:
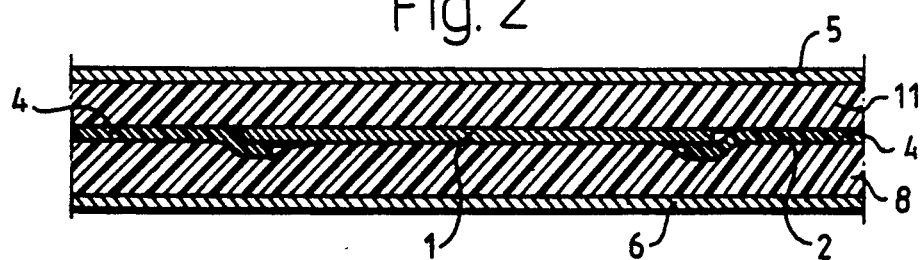

In FIG. 2 is illustrated, in a cross sectional view, the conductive means shown in FIG. 1 of an etched conductor 1 and a support frame 2, which is clamped or otherwise arranged between two plastic sheets 3, 8. The plastics sheets 3, 8 have metal sheets or foils arranged on top thereof, which may constitute ground planes. The material of the plastics sheets or substrate boards 3, 8 may be chosen to have the best possible electrical characteristics without any consideration of their ability to have a copper or other metal layer coated on their surfaces. The cross sectional view in FIG. 2 corresponds to the central part of FIG. 1, where the fingers 4 support the conductor 1.

Figure 3:
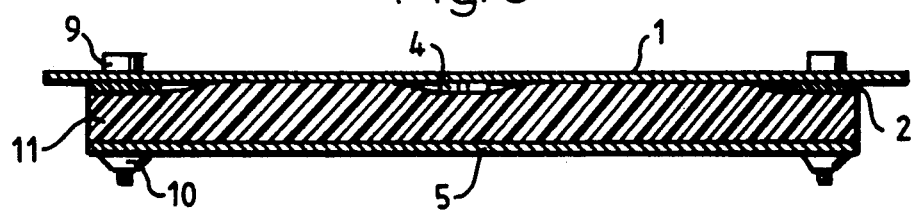

In FIG. 3 is similarly to FIG. 2 illustrated, in a longitudinal cross sectional view, the conductive means shown in FIG. 1 of an etched conductor 1 and a support frame 2, which is clamped to or otherwise arranged on one side of a plastics sheets 3. The plastics sheet 3 has a metal sheet or foil on the other side and this metal layer may constitute a ground plane.

It is obvious that the device described above may be varied in several ways. Thus, the conductive means may naturally comprise more than one conductor, for instance extending in parallel with the first one and/or with each other, and supported by the same support fingers. In FIG. 2 a stripline circuit is shown and in FIG. 3 a microstrip circuit.

With the device according to the invention it is thus possible to select the material in the dielectric sheets which has the most suitable dielectrical and manufacturing characteristics without the restricting requirement that the dielectric material should be laminatable to a copper foil. Also air can form the dielectric, see FIG. 4, the ground plane plates 5, 6 in this case being attached to the conductors 1 at a distance, for instance in the shape of thick frames 7 acting as distance means. The dielectric may also be made of ceramic sheets. The distance means 7 may be electrically conducting and in contact with the ground plates 5, 6 to form a closed shielding of the conductor 1.

Figure 4:
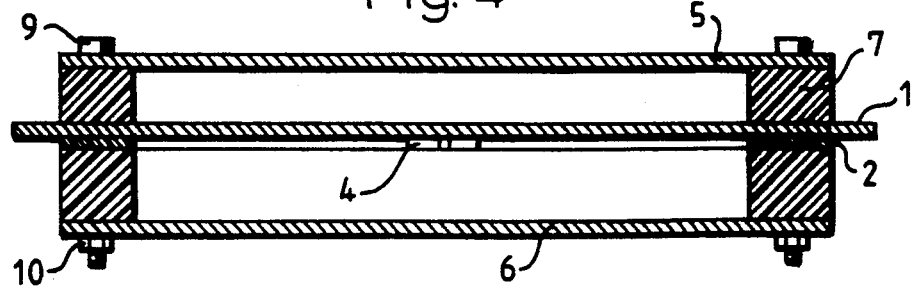

The clamping means may, as is illustrated in FIGS. 3 and 4, comprise screws 9 and nuts 10 tightened to press the various plate shaped parts of the device against each other.

I claim:
1. A device comprising:
   a conductive pattern including at least one conductor;
   a first dielectric plate; and
   a support frame having a window and supporting the conductive pattern;
   wherein the at least one conductor is disposed over the window, and the conductive pattern is disposed adjacent to a surface of the first dielectric plate.
2. The device of claim 1, wherein the first dielectric plate has a surface distal from the conductive pattern, and a metal layer for forming an electrical ground plane is disposed at the distal surface, whereby the device is a microstrip circuit.
3. The device of claim 2, wherein the first dielectric plate comprises air, and the device further comprises means for locating the metal layer at a predetermined distance from the conductive pattern.
4. The device of claim 1, further comprising a second dielectric plate, wherein the conductive pattern is disposed between the first and second dielectric plates, and the first and second plates each have a surface distal from the conductive pattern, and respective metal layers for forming electrical ground planes are disposed at the distal surfaces, whereby the device is a stripline circuit.
5. The device of claim 1, wherein the support frame is a plastic material.
6. The device of claim 5, wherein the window is formed by cutting the support frame with one of a laser beam and a water jet.
7. The device of claim 1, wherein the support frame comprises stabilizing fingers that project into the window and support the at least one conductor.
8. The device of claim 1, wherein the first dielectric plate comprises ceramic material.
9. A circuit board comprising:
   a first dielectric substrate board;
   a pattern of conductors disposed adjacent to a first side of the first dielectric substrate board; and
   a support frame;
   wherein the pattern is disposed atop the support frame, the support frame is thin compared to the first dielectric substrate board, and the pattern and support frame are arranged directly on the first side of the first dielectric substrate board.
10. The circuit board of claim 9, further comprising a second dielectric substrate board, the support frame also being thin compared to the second dielectric substrate board, and the pattern and support frame are also arranged, at their sides distal from the first dielectric substrate board, directly on a first side of the second dielectric substrate board.
11. The circuit board of claim 10, wherein each of the first and second dielectric substrate boards has a second side that is opposite to its first side, and a layer of metal, for connection to a reference potential when the circuit board is used in an electronic equipment, is disposed on each second side.
12. The circuit board of claim 9, wherein the support frame includes at least one aperture, and a part of the pattern is disposed over the at least one aperture.
13. The circuit board of claim 9, wherein the first dielectric substrate board has a second side that is opposite to its first side, and a layer of metal, for connection to a reference potential when the circuit board is used in an electronic equipment, is disposed on the second side.
14. A method of making a circuit board comprising the steps of:
   providing a first dielectric substrate board;
   locating a pattern of conductors adjacent to a first side of the first dielectric substrate board;
   providing a support frame which is thin compared to the first dielectric substrate board;
   attaching the pattern to a top of the support frame; and
   attaching the pattern and support frame to the first side of the first dielectric substrate board.
15. The method of claim 14, further comprising the steps of:
   providing a second substrate board, the support frame also being thin compared to the second substrate board; and
   attaching the pattern and support frame to a first side of the second substrate board so that the pattern and support frame are disposed between the first dielectric substrate board and the second substrate board.

16. The method of claim 15, further comprising the step of providing a metal layer on a second side of the first dielectric substrate board and a metal layer on a second side of the second substrate board, wherein each second side is opposite to the first side of its respective substrate board, and each metal layer is for connection to a reference potential when the circuit board is used in an electronic equipment.

17. The method of claim 14, further comprising the steps of:
 forming an aperture in the support frame; and
 locating a part of the pattern over the aperture.

18. The method of claim 14, further comprising the step of providing a metal layer on a side of the first dielectric substrate board that is distal from the first side, wherein the metal layer is for connection to a reference potential when the circuit board is used in an electronic equipment.

* * * * *